United States Patent [19]
Huynh et al.

[11] Patent Number: 5,704,987
[45] Date of Patent: Jan. 6, 1998

[54] PROCESS FOR REMOVING RESIDUE FROM A SEMICONDUCTOR WAFER AFTER CHEMICAL-MECHANICAL POLISHING

[75] Inventors: Cuc Kim Huynh, Jericho; Matthew Jeremy Rutten, Milton, both of Vt.; Susan L. Cohen, Austin, Tex.; Douglas Paul Nadeau, Underhill, Vt.; Robert Albin Jurjevic, Williston, Vt.; James Albert Gilhooly, St. Albans, Vt.

[73] Assignee: International Business Machines Corporation, Armonk, N.Y.

[21] Appl. No.: 588,943

[22] Filed: Jan. 19, 1996

[51] Int. Cl.[6] ................................................ B08B 7/00
[52] U.S. Cl. .............................. 134/6; 134/26; 134/29
[58] Field of Search ............................. 134/1.3, 2, 29, 134/26, 6, 33; 156/636.1, 638.1

[56] References Cited

U.S. PATENT DOCUMENTS

| | | | |
|---|---|---|---|
| 4,050,954 | 9/1977 | Basi | 134/2 |
| 5,049,200 | 9/1991 | Brunner et al. | 134/2 |
| 5,078,801 | 1/1992 | Malik | 134/29 |
| 5,167,667 | 12/1992 | Prigge et al. | 8/137 |
| 5,259,888 | 11/1993 | McCoy | 134/2 |
| 5,290,361 | 3/1994 | Hayashida et al. | 134/2 |
| 5,320,706 | 6/1994 | Blackwell | 156/636 |
| 5,551,986 | 9/1996 | Jain | 134/6 |

OTHER PUBLICATIONS

Ali et al., "The effect of Secondary Platen Downforce on Post-Chemical Mechanical Planarization Cleaning", *Microcontamination 94 Conference Proceedings*, pp. 196–205 (1994).

Tam et al., "Efficient Laser Removal of Small Particulates Sticking on a Surface", *IBM Technical Disclosure Bulletin 33*, No. 10B, pp. 34–36 (Mar. 1991).

Jeon et al., "Behavior of Polyethylene Oxide based Nonionic Surfactants in Silicon Processing using Alkaline Solutions", Department of Materials Science & Engineering and Department of Chemistry, University of Arizona, pp.1–16 and Figures (1994).

Jeon et al., "CVD Tungsten Wafers Alumina Particle Deposition and Removal", Department of Materials Science & Engineering and Department of Chemistry, University of Arizona, No date available.

Pietsch et al., "Chemomechanical Polishing of Silicon: Surface Termination and Mechanism of Removal", *Appl. Phys. Lett.* 64 (23), pp. 3115–3117 (Jun. 6, 1994).

*Primary Examiner*—Robert J. Warden
*Assistant Examiner*—Alexander Markoff
*Attorney, Agent, or Firm*—Heslin & Rothenberg, P.C.

[57] ABSTRACT

A method for cleaning the surface of a semiconductor wafer by removing residual slurry particles adhered to the wafer surface after chemical-mechanical polishing is provided. The semiconductor wafer is subjected to a first polishing step using a basic aqueous solution of a nonionic polymeric surfactant comprising alkylphenoxypolyethoxyethanol, preferably nonylphenoxypolyethoxyethanol, at a concentration between about 30 to about 100 ppm and a quaternary ammonium hydroxide such as TMAH at a concentration between about 2.5% and about 6% by weight. A downforce of between about 0 and 2 psi ($1.4 \times 10^5$ dynes/cm$^2$) is applied for at least 15 seconds. A second polishing step with an applied downforce of at least 4 psi is then employed while applying purified water. The method provides at least a ten fold reduction in the number of submicronic slurry particles remaining on the wafer surface and can be completed within a commercially acceptable amount of time. In addition, particles as small as 0.007 μm can be removed. The method also provides a level of accuracy in the predictability of the number of residual particles remaining on the wafer surface.

9 Claims, 5 Drawing Sheets

INSPEX TPC 8500 SCANNING LASER IMAGE

INSPEX TPC 8500 SCANNING LASER IMAGE

5,704,987

PROCESS FOR REMOVING RESIDUE FROM A SEMICONDUCTOR WAFER AFTER CHEMICAL-MECHANICAL POLISHING

TECHNICAL FIELD

The present invention relates to a method for cleaning the surface of a semiconductor wafer, and more particularly, to a method for removing residual slurry particles from the wafer surface after chemical-mechanical polishing.

BACKGROUND ART

In the manufacture of integrated circuits, semiconductor wafer surface planarity is of extreme importance. To achieve the degree of planarity required to produce ultra high density integrated circuits, chemical-mechanical polishing/planarization (CMP) is often employed. The terms "planarization" and "polishing" as used herein are interchangeable when referring to the technique of "CMP". In general, CMP involves holding a semiconductor wafer against a moving polishing surface that is wetted with a chemically reactive, abrasive material or slurry, such as silica or alumina. For example, the slurry typically comprises a colloidal suspension of silica particles in a KOH-based solution. The polishing surface is generally a planar pad made of relatively soft, porous material such as blown polyurethane and is usually mounted on a planar platen.

One of the major disadvantages of CMP is the higher defect level observed on post-CMP cleaned wafers. These defects on the semiconductor wafer typically correspond to submicron oxide (e.g. $SiO_2$ or $Al_2O_3$) particles from the polishing slurry that remain on the wafer surface after polishing. A primary concern with the use of CMP is the efficient and complete removal of the polishing slurry to prevent problems in subsequent processing steps.

After CMP, a water rinse and brush scrub is typically employed to remove slurry residue from the surface of the semiconductor wafer. However, this brush cleaning is only partially effective in removing the silica or alumina particles, and thousands of particles submicronic in size typically remain adhered to the surface of the wafer. These residual slurry particles must be removed prior to successive processing steps. If removal is not possible, then the portions of the wafer contaminated with residual slurry particles must be discarded, resulting in a decrease in the overall wafer production yield.

Various methods to remove polishing residue have been employed, ranging from the purely mechanical to the purely chemical etching of the polished wafer surface. However, these methods alone are effective only in removing slurries containing large particles (>0.025 μm) and are thus inefficient in producing a semiconductor wafer surface with an acceptable defect level when a slurry containing particles smaller in size, i.e., 0.007 μm in diameter, is used in conjunction with CMP. The use of polishing slurries having smaller particles therein is often advantageous in obtaining a wafer surface that is smoother, more uniform, and contains fewer scratches.

McCoy in U.S. Pat. No. 5,259,888 teaches a method for cleaning particulates from silicon wafer surfaces comprising contacting the wafer surface (immersion, spraying) with a heated aqueous solution of 0.1%–60% by weight quaternary ammonium hydroxide such as tetramethylammonium hydroxide. A nonionic surfactant such as a polyethylene oxide-based compound may be added in an amount between about 0.01 and about 5 parts by weight. Fast rinsing or immersion with the above solution provides a wafer with a surface from which extraneous deposits have been removed. However, submicron residue particles, not visible to the naked eye, remain adhered to the wafer surface.

Polishing the wafer surface with a surfactant and deionized water mixture is more effective in removing submicronic slurry particles from wafer surfaces than are rinsing processes. Blackwell discloses in U.S. Pat. No. 5,320,706 a method for cleaning semiconductor wafers that have undergone CMP in which a slurry of CAB-O-SPERSE®SC-1, available from Cabot Corporation, is employed. CAB-O-SPERSE® SC-1 contains about 30% silicon dioxide (amorphous), 69% deionized water, and less than 1% potassium hydroxide. The size of the slurry particles varies between about 0.025 μm and about 0.035 μm. According to the method of Blackwell, after CMP, a chemical-mechanical planarizer with a downforce of about 6 psi is applied to the wafer surface for about 30 seconds while a cleaning solution comprising deionized water and a surfactant is applied to the wafer. The number of slurry particles that remained on a 125 mm wafer sample was reduced from 3000 to about 100 particles, a significant improvement over rinsing processes. However, the method is ineffective in removing slurry residue from the wafer surface if the slurry employed during CMP contains particles much smaller in diameter than 0.025 μm, such as those offering improvements in wafer surface smoothness and uniformity which may contain particles as small as 0.007 μm in diameter.

Ali et al. disclose that improved CMP slurry particle removal from 150 mm wafers can be achieved using deionized water and polishing with a downforce of 3 psi and a polishing time of 2 minutes ("The Effect of Secondary Platen Downforce on Post-Chemical Mechanical Planarization Cleaning," Microcontamination Conference Proceedings, 196–204 (1994)). A final particle count of below 100 per 150 mm wafer was observed. They also disclose polishing with a basic solution, such as TMAH, at lower pressures to prevent increased roughness to the wafer surface. The remaining particle level was lowest when polishing with a potassium hydroxide (KOH) solution having a pH of 9.5, between about 30 and 40 particles per 150 mm wafer. The reference makes no mention of particle size, but the method disclosed by Ali suffers from the disadvantage of requiring a lengthy amount of time, 2 minutes, for polishing each wafer to achieve satisfactory removal of the particles. Thus, the process is impractical for commercial manufacturing purposes.

Due to the aforementioned problems with the prior art processes, a need exists for an improved cleaning process that is more effective in removing submicron slurry residue in an acceptable amount of time, especially in removing residue containing particles smaller than 0.025 μm in diameter. Such a method would lead to increased process yields and decreased costs in semiconductor wafer manufacturing. The present invention addresses this need.

DISCLOSURE OF THE INVENTION

The present invention is a new and improved method for removing submicronic residual slurry particles from a semiconductor wafer surface, primarily useful after chemical-mechanical polishing. The method employs two polishing steps using a chemical-mechanical planarizer while simultaneously applying cleaning solutions. The skill and novelty in formulating such an advantageous cleaning process lies in finding the specific chemical compositions of the cleaning solutions and the relative concentrations of each, and in the discovery of the particular mechanical application of the cleaning solutions to the semiconductor wafers to produce a superior effect.

Briefly, the method comprises a first step of polishing the wafer surface simultaneously with the application of a basic rinsing solution comprising a quaternary ammonium hydroxide and a nonionic polymeric surfactant comprising alkylphenoxypolyethoxyethanol. The second step comprises polishing the wafer with purified water.

In particular, the first step comprises pressing a semiconductor wafer, which is held in a wafer polisher by an oscillating carrier, against a rotating polishing pad with about 0 to about 2 psi of downforce while applying an aqueous solution having a pH greater than 10, more preferably greater than 12, for a period of time sufficient to wet the semiconductor wafer surface. The aqueous solution comprises: (1) from about 30 to about 100 ppm of a nonionic polymeric surfactant comprising alkylphenoxypolyethoxyethanol characterized by the formula:

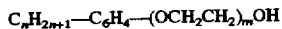

wherein n is from 3 to 10 and m is from 8 to 15; and (2) from about 2.5 to about 6% by weight of a quaternary ammonium hydroxide characterized by the formula:

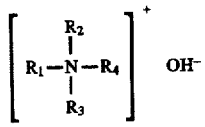

where R1, R2, R3, and R4 are each independently alkyl groups containing from 1 to 10 carbon atoms. The second polishing step comprises pressing the wafer against the polishing pad with at least 4 psi of downforce while applying purified water.

Preferably, the quaternary ammonium hydroxide is present in the solution in an amount of about 4.6% by weight and comprises tetramethylammonium hydroxide (TMAH), wherein $R_1$, $R_2$, $R_3$, and $R_4$ are methyl groups. The alkylphenoxypolyethoxyethanol polymer is preferably nonylphenoxypolyethoxyethanol, wherein n is equal to 9. The polymer is preferably present in the aqueous solution at a level of about 50 ppm.

The amount of time sufficient to wet the semiconductor wafer surface with the aforementioned aqueous solution is preferably at least 15 seconds. The types of particles removed by the process of the present invention generally include inorganic materials, metals, and metal oxides. Typically, the majority of the residual particles removed are silicon dioxide particles from the polishing slurry.

The present invention provides a practical and efficient method for removing submicron residual slurry particles from a semiconductor wafer after the wafer has undergone chemical-mechanical planarization. In addition, the instant wafer cleaning method encompasses numerous advantages over prior art processes. Residual slurry particles much smaller in size than 0.025 μm can be removed in a commercially acceptable amount of time (typically much less than 2 minutes/wafer) to provide a smooth, uniform wafer surface having a defect level that is satisfactory for subsequent processing steps. For example, wafers polished with a silica slurry containing particles as small as 0.007 μm and subjected to the process of the present invention exhibited a reduction in defect level by a factor of at least ten. This results in increased manufacturing productivity and wafer yield and decreased cost and cycle time.

In addition, the instant method is advantageous because it unexpectedly provides control and predictability over the number of particles remaining on the wafer surface after cleaning. Thus, manufacturing costs can be estimated with more accuracy.

The foregoing and other objects, features, and advantages of the invention will be apparent from the following more particular description of the preferred embodiments of the invention as illustrated in the accompanying drawings.

BEST MODE FOR CARRYING OUT THE INVENTION

Figure 1:
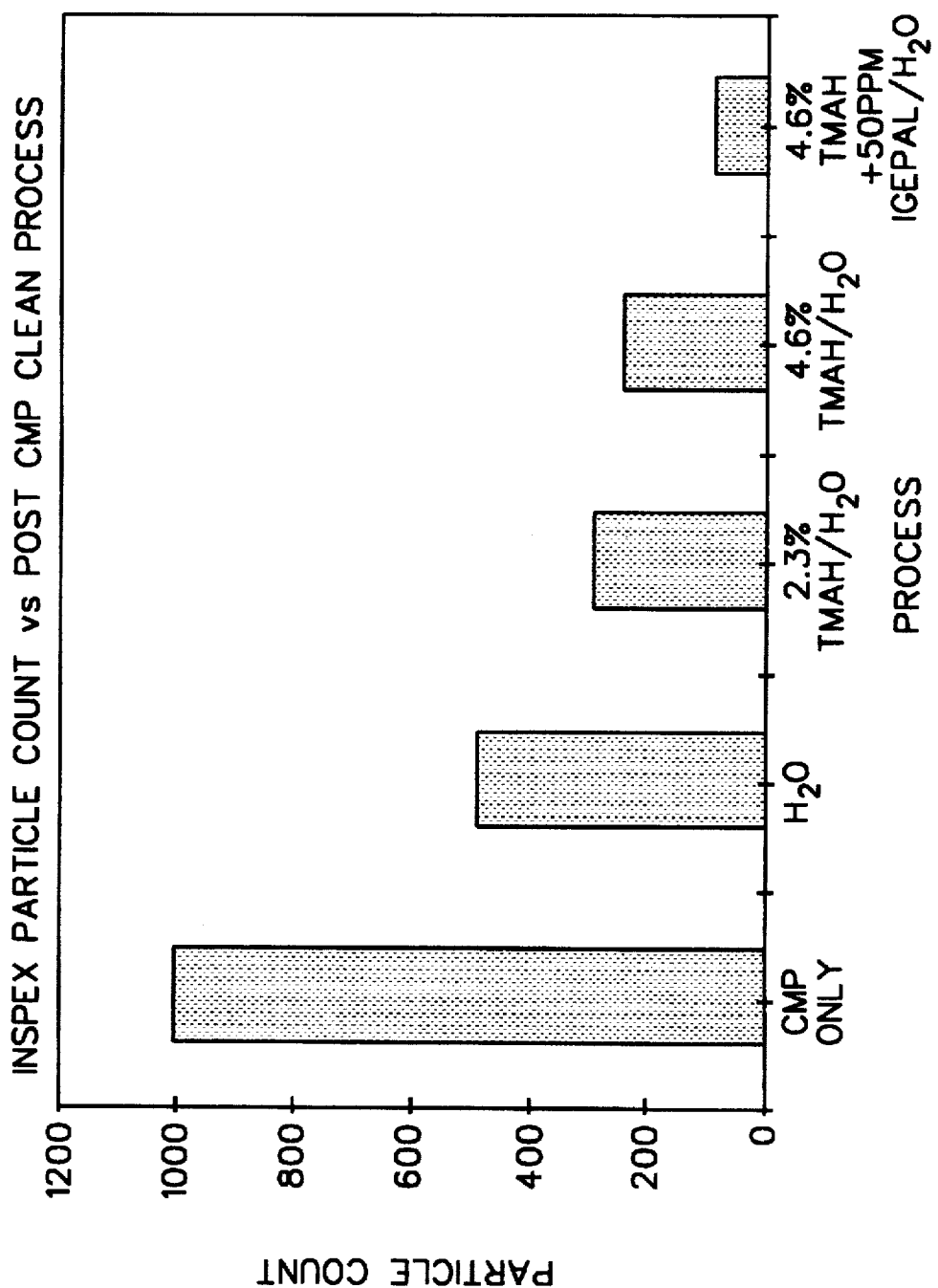
FIG. 1 is a graph showing the reduction in the number of slurry particles remaining on the semiconductor wafer surface using the method of the present invention.

In accordance with the method of the present invention, typically after CMP, the semiconductor wafer is subjected to a first polishing step using a basic aqueous solution of a nonionic polymeric surfactant comprising alkylphenoxypolyethoxyethanol and a quaternary ammonium hydroxide. A second polishing step using purified water is then employed.

The first polishing step of the method of the present invention removes the slurry particles that remain adhered to the semiconductor wafer surface. An aqueous solution having a pH greater than 10, but preferably greater than 12, is applied to a polishing pad of a wafer polisher, typically a chemical-mechanical planarizer/polisher. The semiconductor wafer, which is held in the planarizer by an oscillating carrier, is pressed against the rotating polishing pad with a downforce between about 0 and about 2 psi. The aqueous solution comprises between about 30 and about 100 ppm of a nonionic surfactant comprising a polymer of alkylphenoxypolyethoxyethanol and between about 2.5% to about 6% by weight of a quaternary ammonium hydroxide compound.

The addition of the nonionic polymeric surfactant changes the wettability of the polished wafer surface and its surrounding slurry particle/pad debris environment. While not being limited by any particular theory, it is believed that for the case of polysilicon CMP the surfactant converts the hydrophobic surface of the polished wafer to a hydrophilic state, as discussed below.

The hydrophobic nature of the silicon wafer surface is induced by the oxide (silica or alumina) slurry used during CMP. Formation of hydrogen bonds occurs on the wafer surface as a result of the chemistry employed during the polysilicon polishing process as illustrated below:

Therefore, in particular, for a patterned wafer having a mixture of hydrophobic and hydrophilic patterns, simple rinsing or brushing using known techniques cannot remove the slurry particles adhered to the hydrophobic and/or hydrophilic wafer surfaces effectively.

Removal of polishing slurry particles and metal ions contained therein that are adhered to the wafer surface can be effectively increased by converting the hydrophobic surface of the polished wafer to a hydrophilic state. Such conversion is accomplished by bond formation between the polymeric surfactant and the hydrogen atoms on the wafer surface. The unbonded polar ends of the surfactant, i.e., hydroxide groups, then cover the wafer surface resulting in a wafer surface that is hydrophilic in nature. The conversion is as follows:

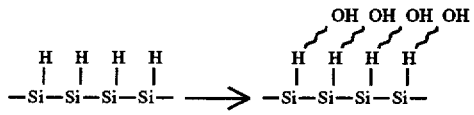

wherein the surfactant bonds directly to the hydrogen atoms extending from the wafer surface. This hydrophilic conversion results in the improved effectiveness of rinsing the wafer surface with water. In addition to creating a hydrophilic wafer surface, the surfactant adheres to the silica particles found in the slurry causing them to repel each other and become less attractive to the wafer surface due to the effects of steric hindrance. Thus, coagulation of the slurry particles is reduced, as is the adherence of the particles to the wafer surface.

The critical concentration and the type of surfactant chosen for use in the method of the present invention are extremely important. A nonionic surfactant containing a hydrophobic nonpolar hydrocarbon chain and a hydrophilic polar group is necessary to catalyze the above reaction. The nonionic surfactant used is an alkylphenoxypolyethoxyethanol-based polymer characterized by the formula $C_nH_{2n+1}$—$C_6H_4$—$(OCH_2CH_2)_mOH$, wherein n is from 3 to 10 and m is from 8 to 15. The preferred nonionic surfactant, wherein n equals 9, is nonylphenoxypolyethoxyethanol, hereinafter referred to as nonylphenol(EO)$_m$. Nonylphenol(EO)$_m$ is commercially available from GAF as ICEPAL®. Another example of a polymeric nonionic surfactant is octylphenoxypolyethoxyethanol, wherein n equals 8, which is commercially available from Union Carbide as TRITON® X100.

The critical micelle concentration (CMC) of nonylphenol (EO)$_m$ is in the range of about 30–100 ppm. Micelles are aggregates of surfactant alkyl groups, typically hydrophobic in nature, which can survive in an aqueous medium, such as in the quaternary ammonium hydroxide or the preferable TMAH system of the present invention. At this CMC level, the surfactant is an effective scavenger to aggregated oxide particles. The surfactant lowers the surface tension of the TMAH solution by a factor greater than 2 (from about 70 to about 32 dynes/cm) and catalyzes a reaction to drive the silicon oxide particles into the aqueous solution, as illustrated above, yielding a cleaner polished wafer surface. At concentrations too far below the CMC, the surfactant is ineffective in forcing the slurry particles into solution. Thus, for optimum cleaning, the nonionic polymeric surfactant, alkylphenoxypolyethoxyethanol, is present at a concentration of about 30–100 ppm in the aqueous cleaning solution of the instant invention, and preferably present at a concentration of about 50 ppm.

A second factor which may contribute to the adherence of the slurry particles to the wafer surface is believed by Applicants to be electrostatic in nature. However, the method of the present invention is not limited by any particular theory. All particulate matter develops an electrically charged thin layer when suspended in a liquid solution. This charge is known as the zeta potential and can be either negative or positive. The zeta potential appears at the outer surface of the particle such that the particle is surrounded by a small charge field.

Without being limited to any particular theory, Applicants believe that placing the silica particles in a basic aqueous solution having a pH of 10 or more results in a negative zeta potential on the silica particles. In addition, the zeta potential of any other particles present, as well as that of the surfaces contacted by the solution, is negative at such a high pH. The silica (SiO$_2$) particles are thus electrostatically repelled from the semiconductor wafer facilitating the removal of the slurry residue from the wafer surface. It is also believed that because the aqueous solution of the present invention is maintained at such a high pH, a small amount of residue on the surface of the wafer is removed by etching during the buffing process. For optimum particle removal, the pH of the solution should be adjusted to a value preferably greater than 12.

The pH is adjusted using a quaternary ammonium hydroxide solution wherein the hydroxide is present between about 2% and about 6% by weight. The quaternary ammonium hydroxide acts as a cationic surfactant and is characterized by the formula:

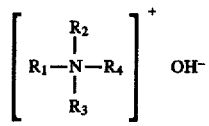

wherein R1, R2, R3, and R4 are each independently alkyl groups containing from 1 to 10 carbon atoms. Examples of quaternary ammonium hydroxides include trimethyl-1-hydroxyethylammonium hydroxide, tetramethylammonium hydroxide (TMAH), and tetrabutylammonium hydroxide. Preferably, a solution of 4.6% by weight TMAH is used in the system to provide a pH greater than 12. Tetramethylammonium hydroxide is available commercially from Aldrich (USA) as a 10% by weight aqueous solution which can be diluted with water to produce a solution having the desired concentration.

Although contacting the semiconductor wafer surface with the solution described above dissolves much of the silica adhering to the wafer, removal of the particles is further facilitated by simultaneously buffing the surface with a polishing pad. The applied mechanical force assists in breaking the bonds between the silica and the wafer, thereby facilitating removal of the silica particles embedded in the wafer surface. A soft polyurethane-based polishing pad such as GS® or POLYTECH SUPREME®, both available from Rodel Corporation, may be used. However, POLYTECH SUPREME® pads may degrade when exposed to solutions having a pH greater than 12, and care must be taken when using such a pad with a cleaning solution having a high pH. The downforce applied while pressing the wafer to the polishing pad should be between about 0 and about 2 psi ($1.4 \times 10^5$ dynes/cm$^2$). At higher pressures, polishing causes additional surface defects and roughness in the semiconductor wafer surface due to the aforementioned etching by the basic quaternary ammonium hydroxide solution.

Polishing with the basic aqueous solution described above continues for a time sufficient to wet the surface of the semiconductor wafer, preferably a minimum of about 15 seconds. Ten seconds is typically insufficient for the surfactant to penetrate the surface of the wafer. When the applied pressure is low, i.e., 0.5 psi, a longer buffing time such as 30 seconds, for example, may be necessary to wet the wafer, but a polishing time of less than one minute is generally sufficient. However, there is no additional benefit in polishing the wafer at any pressure for longer than one and a half minutes. One skilled in the art will appreciate that the wetting times vary with the applied pressure and can accordingly make adjustments.

Applicants have additionally discovered that a second polishing step with water further improves the cleaning process of the present invention. The mechanical force of the water buff at an applied pressure greater than 4 psi assists in breaking the particles from the surface. Typically, a time between about 10 and 30 seconds is adequate. Thus, the combination of both polishing steps, as described above, provides for maximum removal of residual slurry particles, including those smaller in size than 0.025 µm, from the wafer surface in less than 2 minutes, a significant improvement over the prior art.

The process of the present invention is effective in removing undesirable substances from the semiconductor wafer surface including, but not limited to: inorganic materials, such as silicon dioxide, boron, and phosphorous; metals, such as aluminum, titanium, and tungsten; and metal oxides, such as aluminum oxide. The aforementioned metals and nonmetals are often found as impurities in the polishing slurry used during CMP.

Another advantage of the present invention is the improved drying of the cleaned wafers without redepositing materials due to the hydrophilic nature of the processes.

The following examples illustrate the process of the present invention.

EXAMPLE 1

A Model 372 chemical-mechanical planarizer from Westech Systems Inc., Phoenix, Ariz. was used to polish 200 mm polysilicon wafers. The planarizer is a fully automated, single-wafer polishing system with dual polish platens. The oscillating wafer carrier holds the wafer in a free-floating condition against the rotating polish pads for material removal and to maintain uniformity on the wafer surface.

The wafers were polished in the primary platen using a Rodel Corp. GS® polyurethane-based polishing pad. The polishing slurry comprised colloidal fumed silica slurry which is commercially available from Cabot Corp. as CAB-O-SPERSE® SC 720. SC 720 comprises about 12% silicon dioxide (amorphous), 88% deionized water, and less than 1% potassium hydroxide and contains particles having a diameter of about 0.007 µm. After CMP, the slurry was rinsed from each wafer surface for about 15 seconds with purified water. Wafer samples were divided, and a portion were brushcleaned with either an IPEC Westec Model 3800 or a Dia Nippon Screen Model SPW813AS.

Defect level measurements ($\geq 0.2$ µm) were made on the brushcleaned wafers using an INSPEX® TPC 8500 scanning laser system which detects topographical defects and pattern anomalies by light scattering. The detected defects were identified as slurry particles using total reflection X-ray fluorescence (TXRF) and FIB (focus ion beam) techniques. A Seikon FIM 8800 system was used to conduct the FIB analysis, and a Technos TREX 610S system was used for characterization by TXRF of trace metallic and ionic contaminants. Over 1000 particles were observed on each wafer.

A factorial design of experiments was done on the remaining polished wafers in which the composition of the aqueous cleaning solution used with the secondary platen to clean the wafers was varied. A portion were buffed with water alone; some with a solution containing 2.3% by weight TMAH; others with a solution having 4.6% by weight TMAH; and others with a solution containing 4.6% by weight TMAH and 50 ppm IGEPAL®. The wafers were polished for about 25 seconds, and the downforce of the secondary platen was between about 1 and 2 psi. A second polishing step using purified water was performed for about 15 seconds on all wafers cleaned with the TMAH solution. The wafers were then brushcleaned.

FIG. 1 illustrates the improved results obtained in reducing the number of wafer surface particles using the process of the present invention. The number of particles remaining on the surface decreased from about 1000 to about 500 when the wafers were polished with water alone and decreased further as the TMAH concentration and corresponding pH of the solution increased. The least number of particles, between 50 and 100, were observed in samples polished with a solution of 4.6% TMAH and 50 ppm IGEPAL® followed by a second polish with purified water. This is a reduction in surface defects by a factor of at least ten.

EXAMPLE 2

Figure 2A:
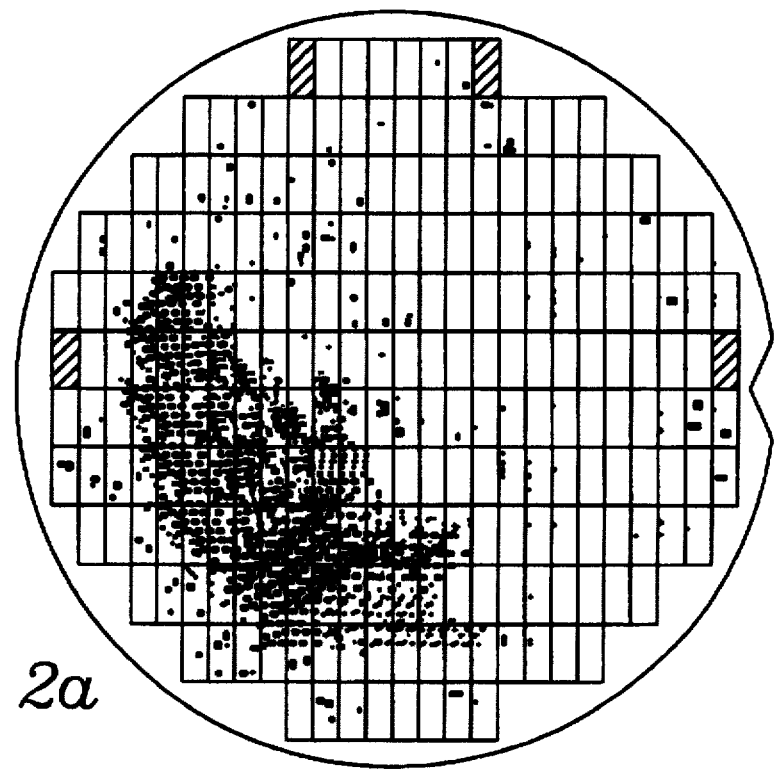
FIG. 2a is an INSPEX® laser system image illustrating the large number of slurry particles remaining on a semiconductor wafer surface after chemical-mechanical polishing.
Figure 2B:
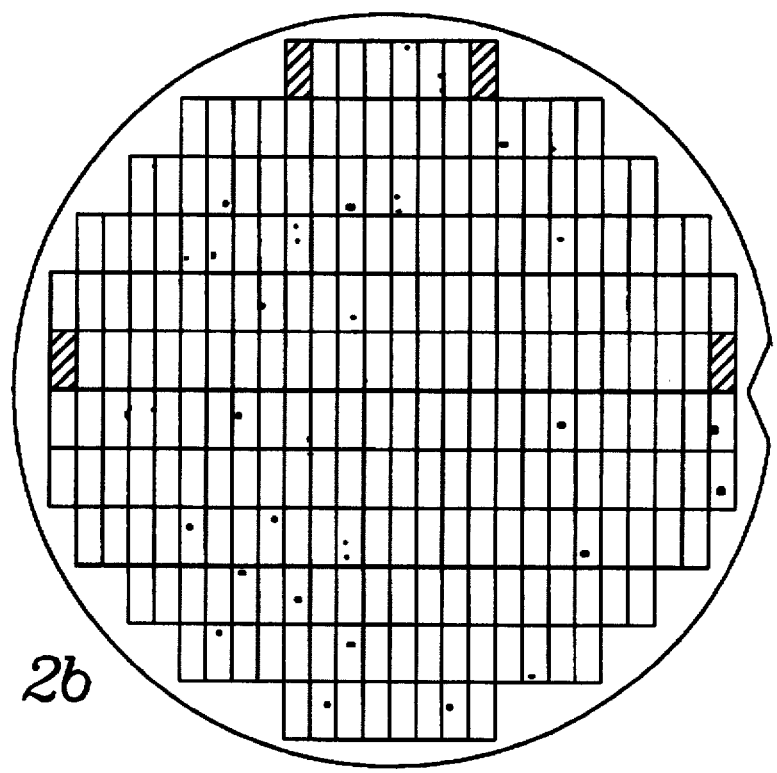
FIG. 2b is an INSPEX® laser system image illustrating the reduction in the number of slurry particles found on the wafer surface of FIG. 2a after employing the method of the present invention.

The same conditions used in Example 1 were followed in this example using a cleaning solution of 4.6% by weight TMAH and 50 ppm IGEPAL®. As indicated by INSPEX® TPC 8500 scanning laser images, which are shown in FIGS. 2a and 2b, defects in the wafers were reduced from greater than 4400 after CMP to about 40, a significant reduction by a factor greater than one hundred.

EXAMPLE 3

Figure 3:
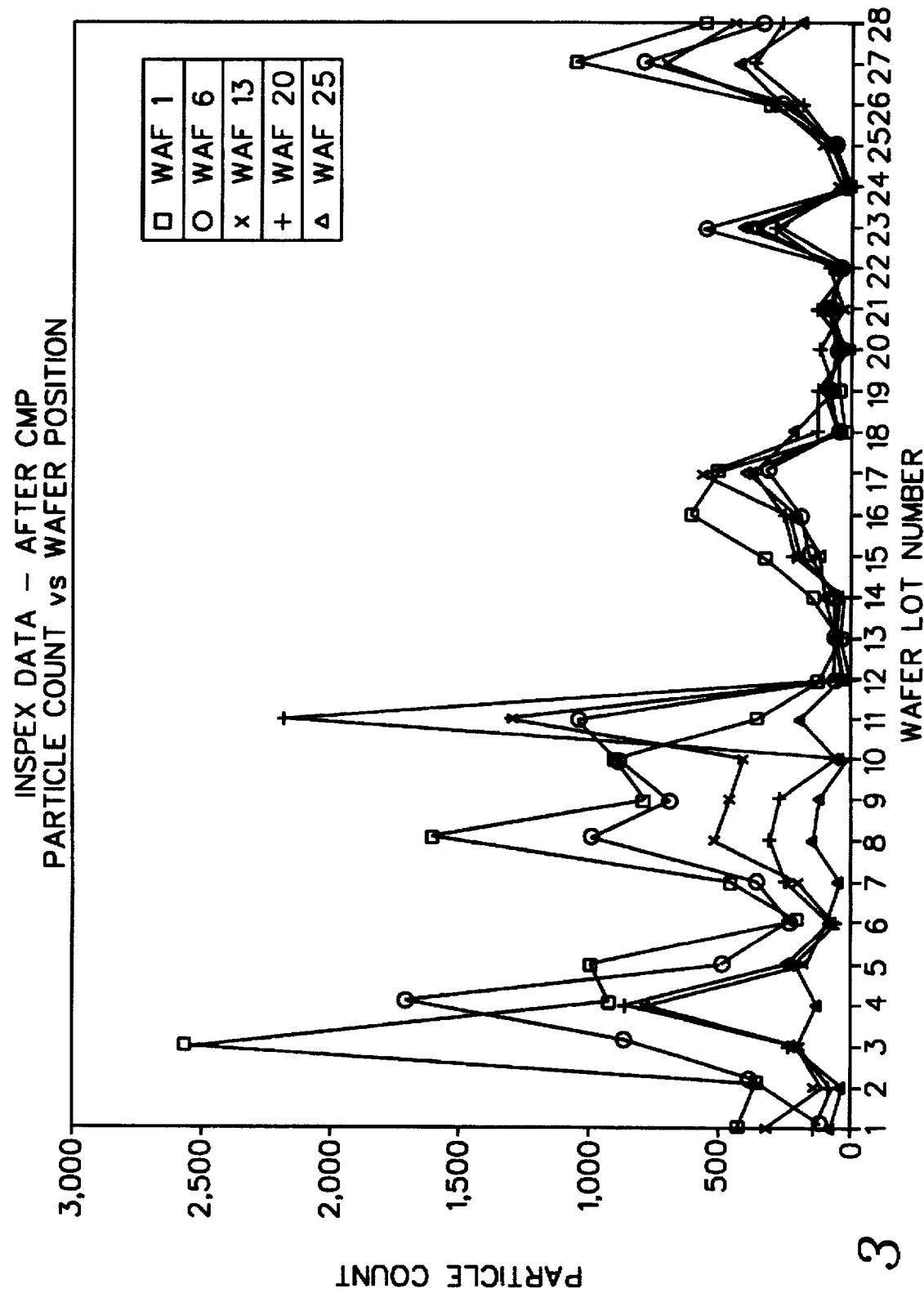
FIG. 3 is a graph showing the number of residual slurry particles remaining on the surfaces of semiconductor wafer samples after chemical-mechanical polishing.
Figure 4:
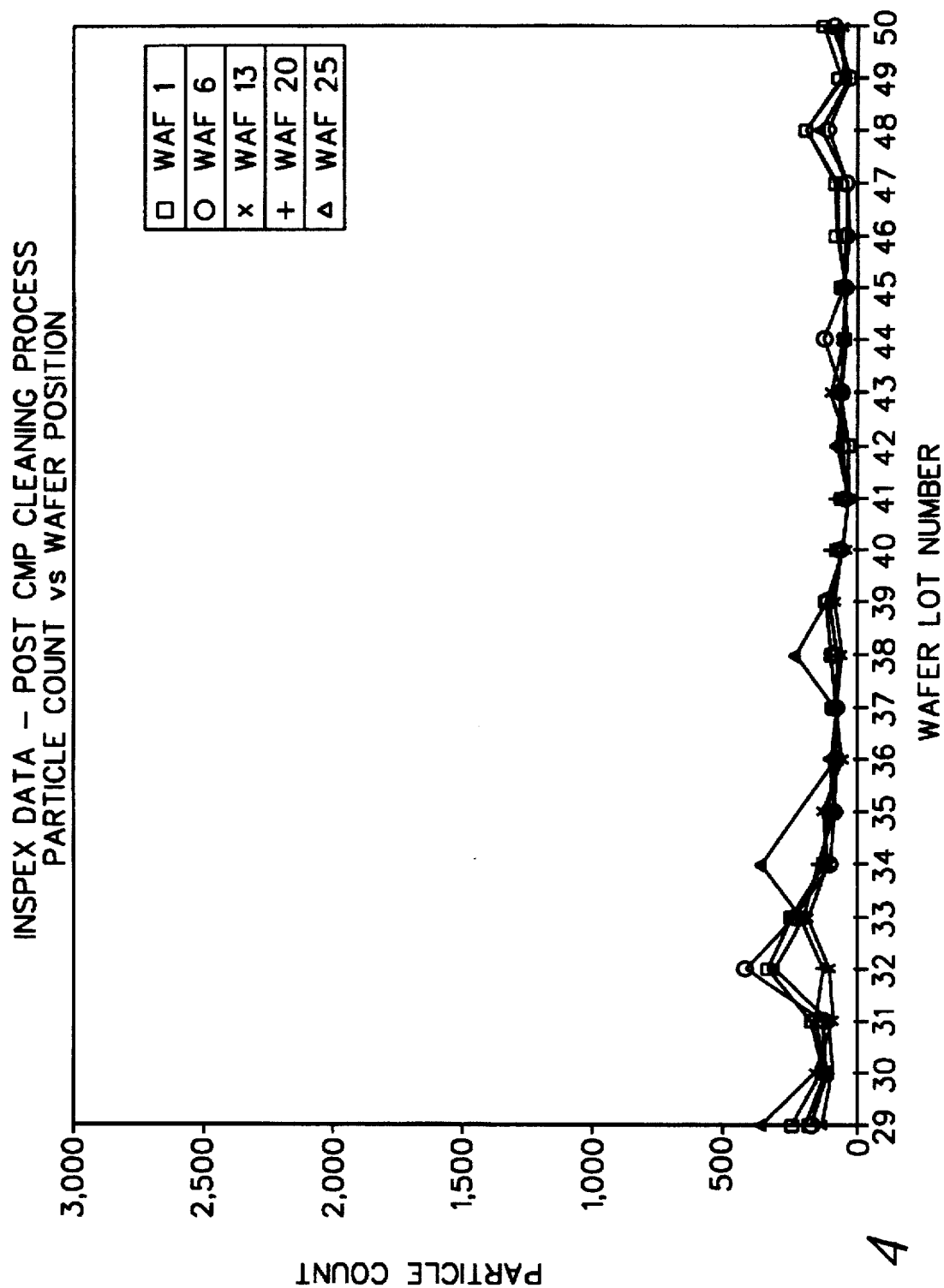
FIG. 4 is a graph showing the reduction in the number of residual slurry particles remaining on the surfaces of semiconductor wafer samples subjected to chemical-mechanical polishing followed by cleaning in accordance with the method of the present invention.

FIGS. 3 and 4 further illustrate the reduction of wafer surface defects when the method of the present invention is employed. FIG. 3 represents the number of slurry particles observed on the surfaces of wafer samples (200 mm) analyzed after CMP. FIG. 4 shows the number of slurry particles remaining on the surfaces of wafer samples (200 mm) that have undergone the secondary polishing process of the instant invention after CMP.

Measurements were made on fifty different wafer lots indicated by number on the X-axis of the graphs. Each lot contained 25 wafers, and 5 representative wafers from each lot were analyzed (waf1, waf6, waf13, waf20, and waf25). Thus, measurements were made on 250 different wafer samples. The number of the wafer indicates the order in which the wafers in each lot were polished with the primary platen, i.e., underwent CMP, such that waf25 corresponds to the wafer that was polished first, and waf1 corresponds to the wafer that was polished last. As shown in FIG. 3, the first polished wafer (waf25) typically has the fewest number of residue particles adhered to its surface after CMP because the polishing pad used has been conditioned and is very clean. However, as CMP proceeds from one wafer within a lot to the next, slurry residue builds up on the polishing pad between wafers. Thus, after the first wafer (waf25) has been polished, slurry residue contaminates all of the remaining wafers within a lot when they are pressed against the polishing pad during CMP. The slurry residue may then become embedded in or adhere to the wafer surface. As shown in FIG. 3, the number of slurry particles remaining on each wafer within a lot is uncontrollable and unpredictable. Thus, the thirteenth wafer polished (waf13) within a lot may or may not have fewer slurry particles on its surface than the twentieth wafer polished (waf6).

Subsequent cleaning of the wafers with the secondary platen according to the method of the present invention provides a level of control over the number of particles on a wafer irrespective of what position the wafer held during chemical-mechanical planarization with the primary platen. Comparison of FIG. 3 with FIG. 4 shows a significant reduction in the number of residual particles on the wafers that have undergone the process of the present invention from over 2500 to below 100. In addition, FIG. 4 shows the predictability and tight control that can be obtained over the number of particles remaining on the wafer surface of all the wafers within a lot, not just the first wafer. Thus, another unexpected advantage to using the process of the present invention is the control and predictability of the number of particles remaining on the wafer surface.

Figure 5:
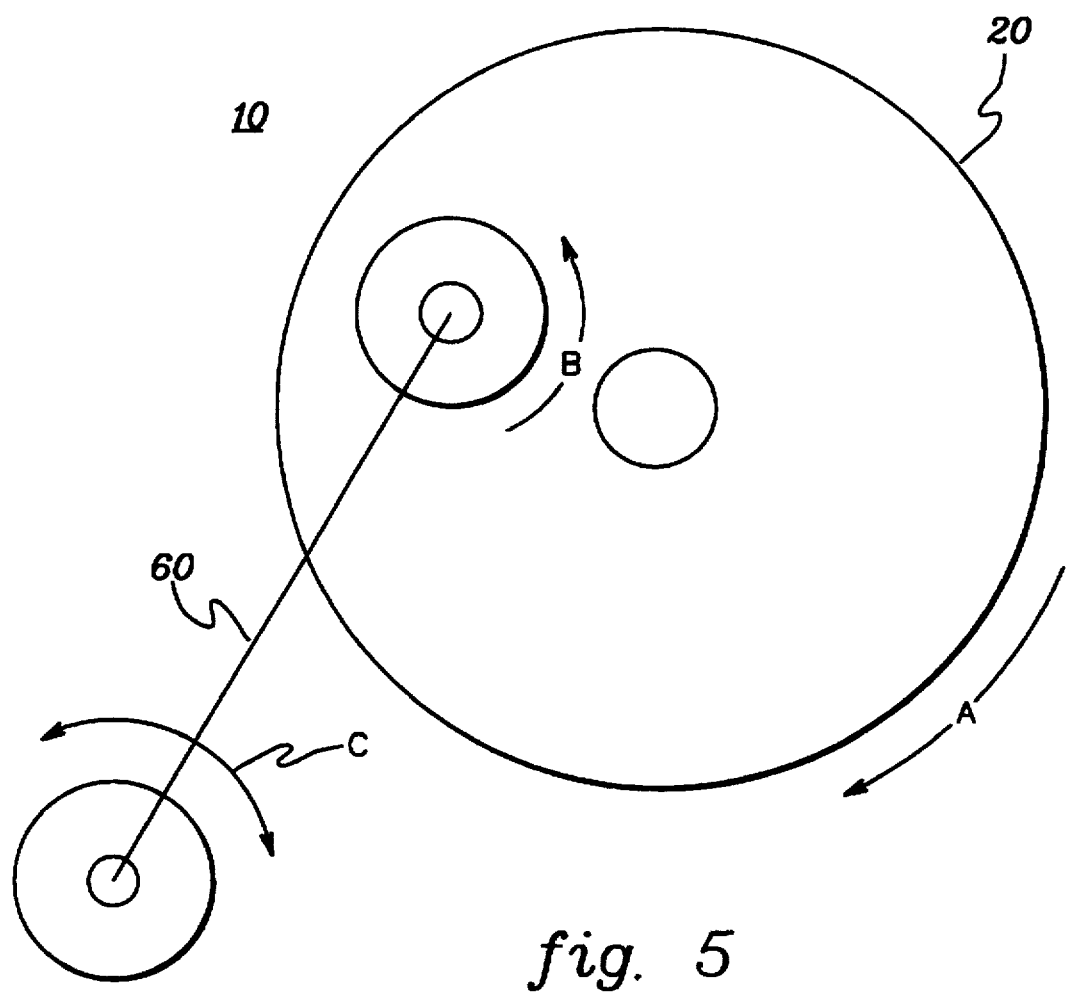
FIG. 5 is a top view of a portion of a simplified wafer polisher or chemical-mechanical planarizer.
Figure 6:
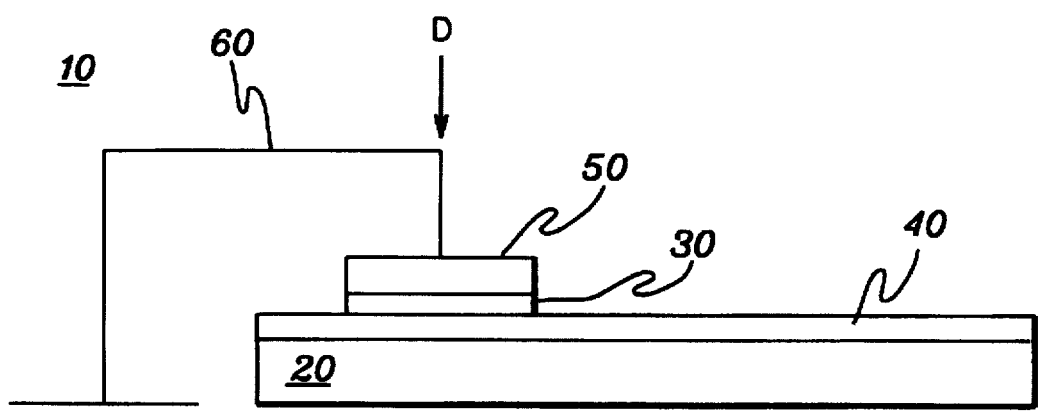
FIG. 6 is a side view of the wafer polisher of FIG. 5.

FIGS. 5 and 6 are top and side views, respectively, of a portion 10 of a simplified wafer polisher or chemical-mechanical planarizer. Platen 20 is rotated as indicated by arrow A. Semiconductor wafer 30 is pressed against polishing pad 40 by plate 50. Plate 50 and oscillating carrier 60 hold wafer 30 against polishing pad 40. Carrier 60 oscillates as shown in FIG. 5 by arrow B. A downward force is applied to wafer 30 as shown by arrow D.

The present invention provides a practical method for removing residual slurry particles from a semiconductor wafer surface after chemical-mechanical planarization, which is an improvement over prior art processes. A greater number of particles, smaller in size, can be removed, which results in at least a ten fold reduction in defect density as indicated by scanning laser measurements. In addition, a relatively short amount of cleaning time is needed to produce wafers having a smooth, uniform surface which are ready for further processing with only a minimal amount of waste. Thus, wafer yield is increased while production costs and cycle times are reduced. In addition, the predictability of the number of particles remaining on the wafer surface provides additional control over the costs of semiconductor wafer manufacturing and allows cost estimates to be made with a higher level of accuracy.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A method for removing residual particles from a semiconductor wafer after chemical-mechanical planarization, said wafer being held in a wafer polisher by an oscillating carrier, comprising the steps of:

(a) pressing said semiconductor wafer against a rotating polishing pad with greater than 0 to about 2 psi (1.4× $10^5$ dynes/cm$^2$) of downforce while applying to said rotating polishing pad an aqueous solution having a pH greater than about 10 for a period of time sufficient to wet said semiconductor wafer surface, said aqueous solution comprising from about 30 to about 100 ppm of a nonionic polymeric surfactant comprising alkylphenoxypolyethoxyethanol characterized by the formula:

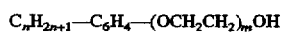

wherein n is from 3 to 10 and m is from 8 to 15; and from about 2.5 to about 6% by weight of a quaternary ammonium hydroxide characterized by the formula:

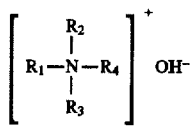

wherein R1, R2, R3, and R4 are each independently alkyl groups containing from 1 to 10 carbon atoms; and (b) pressing said wafer against said rotating polishing pad with at least 4 psi of downforce while applying water.

2. The method according to claim 1, wherein said aqueous solution has a pH greater than about 12.

3. The method according to claim 1, wherein said alkylphenoxypolyethoxyethanol polymer comprises nonylphenoxypolyethoxyethanol, and wherein n is equal to 9.

4. The method according to claim 1, wherein said alkylphenoxypolyethoxyethanol polymer is present at a level of about 50 ppm.

5. The method according to claim 1, wherein said quaternary ammonium hydroxide is tetramethylammonium hydroxide, and wherein $R_1$, $R_2$, $R_3$, and $R_4$ are methyl groups.

6. The method according to claim 1, wherein said quaternary ammonium hydroxide is present at a level of about 4.6% by weight.

7. The method according to claim 1, wherein said time sufficient to wet said surface of said semiconductor wafer is at least 15 seconds.

8. The method according to claim 1, wherein said residual particles are selected from the group consisting of inorganic materials, metals, and metal oxides.

9. The method according to claim 1, wherein said residual particles comprise silicon dioxide.

* * * * *